(12) United States Patent
Kawabata

(10) Patent No.: US 9,907,179 B2
(45) Date of Patent: Feb. 27, 2018

(54) ELECTRONIC CIRCUIT PACKAGE

(71) Applicant: TDK Corporation, Tokyo (JP)

(72) Inventor: Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 117 days.

(21) Appl. No.: 15/137,106

(22) Filed: Apr. 25, 2016

(65) Prior Publication Data

US 2017/0311448 A1 Oct. 26, 2017

(51) Int. Cl.
| H05K 1/18 | (2006.01) |
| H01F 1/03 | (2006.01) |
| H05K 1/02 | (2006.01) |

(52) U.S. Cl.
CPC ........... *H05K 1/182* (2013.01); *H01F 1/0306* (2013.01); *H05K 1/0216* (2013.01)

(58) Field of Classification Search
CPC ..... H05K 1/182; H05K 1/0216; H01F 1/0306
See application file for complete search history.

(56) References Cited

U.S. PATENT DOCUMENTS

| 5,561,265 | A * | 10/1996 | Livshits | H01L 23/08 |
| | | | | 174/386 |
| 6,310,285 | B1 * | 10/2001 | Sato | H01F 1/24 |
| | | | | 174/390 |
| 6,713,671 | B1 * | 3/2004 | Wang | A61N 1/16 |
| | | | | 174/391 |
| 6,998,532 | B2 * | 2/2006 | Kawamoto | H01L 24/16 |
| | | | | 174/521 |
| 2004/0252475 | A1 * | 12/2004 | Tsuneoka | H01L 23/3121 |
| | | | | 361/816 |
| 2005/0106060 | A1 * | 5/2005 | Kato | B22F 9/08 |
| | | | | 420/560 |
| 2011/0006106 | A1 * | 1/2011 | Kanryo | H01L 23/552 |
| | | | | 228/170 |
| 2013/0126866 | A1 * | 5/2013 | Hatsukawa | H01L 22/22 |
| | | | | 257/48 |
| 2013/0327444 | A1 * | 12/2013 | Sawamura | B23K 35/025 |
| | | | | 148/24 |
| 2015/0052743 | A1 * | 2/2015 | Kawabata | H01L 21/67092 |
| | | | | 29/829 |

FOREIGN PATENT DOCUMENTS

| JP | S59-132196 | 7/1984 |
| JP | H02-078299 | 3/1990 |
| JP | H10-064714 | 3/1998 |
| JP | H01-283900 | 11/1999 |

* cited by examiner

*Primary Examiner* — Yuriy Semenenko
(74) *Attorney, Agent, or Firm* — Young Law Firm, P.C.

(57) ABSTRACT

Disclosed herein is an electronic circuit package includes: a substrate having a power supply pattern; an electronic component mounted on a surface of the substrate; a magnetic mold resin formed of a composite magnetic material including a thermosetting resin material and a magnetic filler, the magnetic mold resin covering the surface of the substrate so as to embed therein the electronic component; and a metal film connected to the power supply pattern and covering at least a top surface of the magnetic mold resin. A volume resistance value of the magnetic mold resin is equal to or larger than $10^{10}\Omega$, and a resistance value at an interface between the top surface of the magnetic mold resin and the metal film is equal to or larger than $10^{6}\Omega$.

13 Claims, 12 Drawing Sheets

FIG. 17

| | SAMPLE A1 | SAMPLE A2 | SAMPLE A3 | SAMPLE A4 | SAMPLE B1 | SAMPLE B2 | SAMPLE B3 |
|---|---|---|---|---|---|---|---|
| MOLD MATERIAL | COMPOSITE MAGNETIC MATERIAL | NON-MAGNETIC MATERIAL | COMPOSITE MAGNETIC MATERIAL | COMPOSITE MAGNETIC MATERIAL | COMPOSITE MAGNETIC MATERIAL | COMPOSITE MAGNETIC MATERIAL | COMPOSITE MAGNETIC MATERIAL |
| METAL FILM | NO | EQUIPPED | EQUIPPED | EQUIPPED | EQUIPPED | EQUIPPED | EQUIPPED |
| THICKNESS OF INSULATION COAT | 30nm | - | 0nm | 5nm | 10nm | 30nm | 40nm |
| VOLUME RESISTANCE/ SURFACE RESISTANCE | $> 10^{14}\,\Omega$ | $> 10^{14}\,\Omega$ | $> 10^{4}\,\Omega$ | $> 10^{7}\,\Omega$ | $> 10^{12}\,\Omega$ | $> 10^{14}\,\Omega$ | $> 10^{14}\,\Omega$ |
| PERMEABILITY (10MHz) | 14.0 | - | 14.5 | 14.3 | 14.1 | 14.0 | 13.8 |
| NOISE ATTENUATION (20MHz) | 6dBuV | 13dBuV | 20dBuV | 22dBuV | 28dBuV | 29dBuV | 29dBuV |
| NOISE ATTENUATION (50MHz) | 6dBuV | 18dBuV | 25dBuV | 27dBuV | 34dBuV | 34dBuV | 35dBuV |
| NOISE ATTENUATION (100MHz) | 7dBuV | 25dBuV | 33dBuV | 34dBuV | 39dBuV | 39dBuV | 40dBuV |

ELECTRONIC CIRCUIT PACKAGE

BACKGROUND OF THE INVENTION

Field of the Invention

The present invention relates to an electronic circuit package and, more particularly, to an electronic circuit package provided with a composite shielding function having both an electromagnetic shielding function and a magnetic shielding function.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

In order to realize the higher shielding characteristics, a composite shielding structure is proposed in recent years. The composite shielding structure has both an electromagnetic shielding function and a magnetic shielding function. In order to realize the composite shielding structure, it is necessary to form, in an electronic circuit package, an electromagnetic shielding by a conductive film (metal film) and a magnetic shielding by a magnetic film.

For example, Japanese Patent Application Laid-Open No. 1984-132196 discloses an electronic circuit package whose shielding characteristics are enhanced by molding an electronic circuit using a magnetic mold resin and covering the entire structure with a metal casing.

However, in the electronic circuit package disclosed in Japanese Patent Application Laid-Open No. 1984-132196, the covering of the entire structure with the metal casing makes reduction in height difficult. Further, the metal casing has a large number of holes formed therein and is not connected to a ground pattern of a substrate, so that a sufficient shielding effect cannot be obtained. In addition, when an eddy current occurs due to incidence of electromagnetic wave noise in the metal casing, the eddy current flows in the magnetic mold resin to deteriorate magnetic characteristics of the magnetic mold resin.

SUMMARY

An object of the present invention is therefore to provide an electronic circuit package capable of realizing both high composite shielding effect and reduction in height and capable of preventing deterioration in magnetic characteristics of a magnetic mold resin due to eddy current.

An electronic circuit package according to the present invention includes a substrate having a power supply pattern; an electronic component mounted on a surface of the substrate; a magnetic mold resin formed of a composite magnetic material including a thermosetting resin material and a magnetic filler and covering the surface of the substrate so as to embed therein the electronic component; and a metal film connected to the power supply pattern and covering at least a top surface of the magnetic mold resin. A volume resistance value of the magnetic mold resin is equal to or larger than $10^{10} \Omega$, and a resistance value at an interface between the top surface of the magnetic mold resin and the metal film is equal to or larger than $10^6 \Omega$.

According to the present invention, the volume resistance value of the magnetic mold resin is equal to or larger than $10^{10} \Omega$, so that sufficient insulation performance required for the mold member can be ensured. In addition, the resistance value at an interface between the top surface of the magnetic mold resin and the metal film is equal to or larger than $10^6 \Omega$, thereby substantially preventing an eddy current generated when electromagnetic wave noise enters the metal film from flowing in the magnetic mold resin. As a result, it is possible to prevent deterioration in magnetic characteristics of the magnetic mold resin due to inflow of the eddy current. Furthermore, a metal film is used in place of a metal casing, and there is no need to form a magnetic film on the mold material, thereby making it possible to achieve reduction in height.

In the present invention, it is preferable that the metal film covers also a side surface of the magnetic mold resin and that a resistance value at an interface between the side surface of the magnetic mold resin and the metal film is equal to or larger than $10^6 \Omega$. With this configuration, it is possible to enhance composite shielding characteristics in a side surface direction.

The electronic circuit package according to the present invention may further include an insulating material provided between the magnetic mold resin and the metal film. With this configuration, even when the surface resistance value of the magnetic mold resin is small, the resistance value at the interface between the magnetic mold resin and the metal film can be made equal to or larger than $10^6 \Omega$.

Preferably, in the present invention, the magnetic filler includes a soft magnetic metal. This can enhance permeability of the magnetic mold resin. As a main component of the soft magnetic metal, at least one magnetic material selected from a group consisting of Fe, Fe—Co, Fe—Ni, Fe—Al, and Fe—Si may be used. Preferably, a surface of the magnetic filler is preferably insulation-coated, and more preferably, a film thickness of the insulation coating is equal to or larger than 10 nm. This can sufficiently enhance the volume resistance of the magnetic mold resin. A shape of the magnetic filler is preferably substantially spherical. This can increase a ratio of the magnetic filler in the magnetic mold resin.

In the present invention, the magnetic mold resin may further include a non-magnetic filler. Addition of the non-magnetic filler allows achievement of a high filling level of the filler in the magnetic mold resin, whereby heat expansion coefficient can be controlled. Further, the presence of the non-magnetic filler allows fluidity at the molding time, dielectric characteristics, and mechanical properties such as strength or elastic modulus to be controlled. This can further enhance withstand voltage performance, insulating performance, and incombustibility.

Preferably, in the present invention, the metal film is mainly composed of at least one metal selected from a group consisting of Au, Ag, Cu, and Al, and more preferably, the surface of the metal film is covered with an antioxidant film.

In the present invention, it is preferable that the power supply pattern is exposed to a side surface of the substrate and that the metal film contacts the exposed power supply pattern. With this configuration, it is possible to easily and reliably connect the metal film to the power supply pattern.

The electronic circuit package according to the present invention may further include a non-magnetic member provided between the electronic component and the magnetic mold resin. With this configuration, it is possible to suppress fluctuation of characteristics of the electronic component due to proximity between the electronic component and the magnetic mold resin.

As described above, according to the present invention, it is possible to realize both high composite shielding effect and reduction in height and to prevent deterioration in magnetic characteristics of the magnetic mold resin due to eddy current.

BRIEF DESCRIPTION OF THE DRAWINGS

The above features and advantages of the present invention will be more apparent from the following description of certain preferred embodiments taken in conjunction with the accompanying drawings, in which:

FIG. 17 is a table indicating measurement results of examples.

DETAILED DESCRIPTION OF THE EMBODIMENTS

Preferred embodiments of the present invention will be explained below in detail with reference to the accompanying drawings.

First Embodiment

Figure 1:
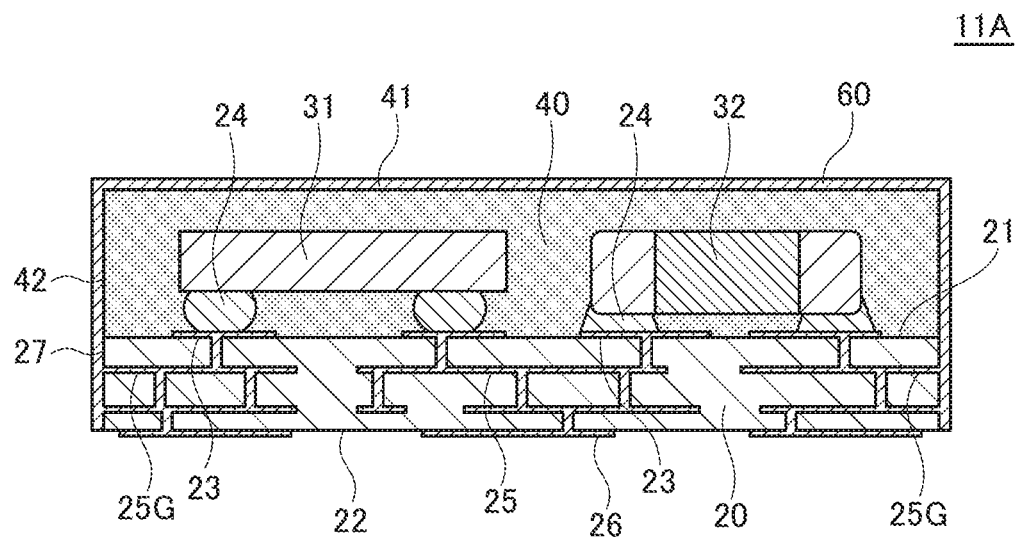
FIG. 1 is a cross-sectional view illustrating a configuration of an electronic circuit package according to a first embodiment of the present invention.

FIG. 1 is a cross-sectional view illustrating a configuration of an electronic circuit package 11A according to the first embodiment of the present invention.

As illustrated in FIG. 1, the electronic circuit package 11A according to the present embodiment includes a substrate 20, a plurality of electronic components 31 and 32 mounted on the substrate 20, a magnetic mold resin 40 covering a front surface 21 of the substrate 20 so as to embed the electronic components 31 and 32, and a metal film 60 covering the magnetic mold resin 40.

Although the type of the electronic circuit package 11A according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester substrate, a phenol substrate, or an imide substrate; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 and two wiring layers embedded therein. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) may be embedded in the substrate 20.

The land patterns 23 are connected to external terminals 26 formed on the back surface 22 of the substrate 20 through internal wirings 25 formed inside the substrate 20. Upon actual use, the electronic circuit package 11A is mounted on an unillustrated mother board, and land patterns on the mother board and the external terminals 26 of the electronic circuit package 11A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and conductivity. The above conductive materials may be formed by using various methods such as printing, plating, foil lamination, sputtering, vapor deposition, and inkjet.

Out of the internal wirings 25 illustrated in FIG. 1, internal wirings 25G are power supply patterns. The power supply patterns 25G are typically ground patterns to which a ground potential is to be applied; however, it is not limited to the ground patterns as long as the power supply patterns 25G are a pattern to which a fixed potential is to be applied.

The magnetic mold resin 40 covers the front surface 21 of the substrate 20 so as to embed the electronic components 31 and 32 therein. The magnetic mold resin 40 is a mold member and serves also as a magnetic shielding. In the present embodiment, a side surface 42 of the magnetic mold resin 40 and a side surface 27 of the substrate 20 form the same plane. The magnetic mold resin 40 is formed of a composite magnetic material in which magnetic fillers are dispersed in a thermosetting resin material. The magnetic mold resin 40 contacts the electronic components 31, 32 and land patterns 23, so that the volume resistance value thereof needs to be sufficiently large. Specifically, the volume resistance value needs to be equal to or larger than $10^{10} \Omega$.

As the thermosetting resin material used for the composite magnetic material, an epoxy resin, a phenol resin, a silicone resin, a diallyl phthalate resin, a polyimide resin, an urethane resin, and the like may be used, and preferably, a base resin and a curing agent to be used for an epoxy resin- or a phenol resin-based semiconductor sealing material is used. The thermosetting resin material may be either liquid or solid, and the material form differs depending on selection of the base resin and curing agent according to a molding method. When a solid material is used, a material formed into a tablet can be used for transfer molding, and a material formed into a granular form can be used for injection molding or compression molding. A molding method for the thermosetting resin material may be appropriately be selected from among transfer molding, compression molding, injection molding, cast molding, vacuum cast molding, dispense molding, and molding using a slit nozzle. Molding conditions may be appropriately selected from among various combinations of the base resin, curing agent, and curing accelerator to be used. Post-curing may be applied after molding, as required.

The magnetic filler used for the composite magnetic material is preferably a soft magnetic metal having a high bulk permeability. As the soft magnetic metal, at least one magnetic material selected from a group consisting of Fe, Fe—Co, Fe—Ni, Fe—Al, and Fe—Si may be used. Specific examples include a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, and Fe. The shape of the magnetic filler is not especially limited; however, it may be formed into a spherical shape for a high filling level, and fillers of a plurality of particle sizes may be blended for a densest filling structure. Further, when the magnetic filler is formed into substantially a spherical shape, it is possible to reduce damage to be applied to the electronic components 31 and 32 upon molding.

A surface of the magnetic filler is preferably insulation-coated with a metal oxide such as Si, Al, Ti, Mg or an organic material for enhancing fluidity, adhesion, and insulation performance. In order to sufficiently increase the volume resistance value of the magnetic mold resin 40, a film thickness of the insulation coating is preferably set to equal to or larger than 10 nm. The insulation coating may be formed by coating a thermosetting material on the surface of the magnetic filler. Alternatively, an oxide film may be formed as the insulation coating by dehydration reaction of a metal alkoxide of tetraethyloxysilane or tetramethyloxysilane, and in this case, formation of a silicon oxide coating film is most preferable. More preferably, organic functional coupling treatment is applied to the formed coating film.

The composite magnetic material forming the magnetic mold resin 40 may be blended with a non-magnetic filler. When molten silica, calcium carbonate, magnesium oxide, aluminum oxide, titanium oxide, or the like is used as the non-magnetic filler, the insulating performance and withstand voltage performance of the magnetic mold resin 40 can be enhanced, and, further, incombustibility can be imparted to the magnetic mold resin 40. In addition, fluidity, dielectric constant, mechanical properties such as strength or elastic modulus can be controlled. Further, achievement of the high filling level by addition of the non-magnetic filler can reduce a heat expansion coefficient. In this case, a filler having a low heat expansion coefficient, such as molten silica or zirconium phosphate is preferably used. In order to enhance slidability and fluidity between fillers, surface-treated nanosilica having a particle size of equal to or smaller than 200 nm is preferably used. Further, coupling treatment may be applied to a surface of the non-magnetic filler for enhancement of adhesion and fluidity.

The top and side surfaces 41 and 42 of the magnetic mold resin 40 and the side surface 27 of the substrate 20 are covered with the metal film 60. The metal film 60 serves as an electromagnetic shielding and is preferably mainly composed of at least one metal selected from a group consisting of Au, Ag, Cu, and Al. The metal film 60 preferably has a resistance as low as possible and most preferably uses Cu in terms of cost. An outer surface of the metal film 60 is preferably covered with an anticorrosive metal such as SUS, Ni, Cr, Ti, or brass or an antioxidant film made of a resin such as an epoxy resin, a phenol resin, an imide resin, an urethane resin, or a silicone resin. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

As illustrated in FIG. 1, the power supply patterns 25G are exposed to the side surfaces 27 of the substrate 20. The metal film 60 covers the side surfaces 27 of the substrate 20 and is thereby connected to the power supply pattern 25G.

A resistance value at an interface between the metal film 60 and the magnetic mold resin 40 is equal to or larger than $10^6 \Omega$. Thus, an eddy current generated when electromagnetic wave noise enters the metal film 60 hardly flows in the magnetic mold resin 40, which can prevent deterioration in the magnetic characteristics of the magnetic mold resin 40 due to inflow of the eddy current. The resistance value at the interface between the metal film 60 and the magnetic mold resin 40 refers to a surface resistance of the magnetic mold resin 40 when the metal film 60 and magnetic mold resin 40 directly contact each other and to a surface resistance of an insulating film when the insulating film is present between the metal film 60 and the magnetic mold resin 40. The resistance value at the interface between the metal film 60 and the magnetic mold resin 40 is preferably equal to or larger than $10^6\Omega$ over the entire area of the interface; however, it does not matter if the resistance value is partly smaller than $10^6\Omega$.

Basically, the surface resistance value of the magnetic mold resin 40 substantially coincides with the volume resistance of the magnetic mold resin 40. Thus, basically, when the volume resistance value of the magnetic mold resin 40 is equal to or larger than $10^{10}\Omega$, the surface resistance value of the magnetic mold resin 40 is also equal to or larger than $10^{10}\Omega$. However, as described later, the magnetic mold resin 40 undergoes dicing at manufacturing, so that the magnetic filler made of a soft magnetic metal may be exposed to a cut surface (i.e., side surface 42), and in this case, the surface resistance value of the side surface 42 becomes smaller than the volume resistance value. Similarly, when the top surface 41 of the magnetic mold resin 40 is ground for reducing height or roughing the surface, the magnetic filler made of a soft magnetic metal may be exposed to the top surface 41, and in this case, the surface resistance value of the top surface 41 becomes smaller than the volume resistance value. As a result, even when the volume resistance value of the magnetic mold resin 40 is equal to or larger than $10^{10}\Omega$, the surface resistance value of the magnetic mold resin 40 may be smaller than $10^{10}\Omega$; however, in such a case, when the surface resistance value of the magnetic mold resin 40 is equal to or larger than $10^6\Omega$, it is possible to prevent inflow of the eddy current.

Figure 2:
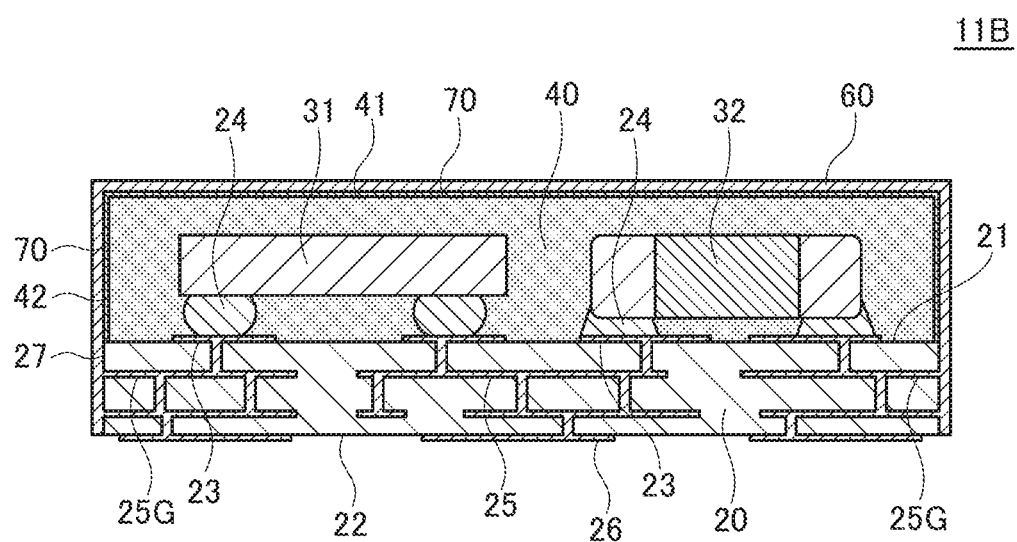
FIG. 2 is a cross-sectional view illustrating a configuration of an electronic circuit package according to a first modification of the first embodiment.

When the surface resistance value of the top surface 41 or side surface 42 of the magnetic mold resin 40 is reduced to smaller than $10^6\Omega$, a thin insulating material may be formed on the top surface 41 or side surface 42 of the magnetic mold resin 40. FIG. 2 is a cross-sectional view illustrating a configuration of an electronic circuit package 11B according to a first modification. The electronic circuit package 11B of FIG. 2 differs from the electronic circuit package 11A of FIG. 1 in that a thin insulating film 70 is interposed between the top surface 41 and side surfaces 42 of the magnetic mold resin 40 and the metal film 60. With this configuration, even when the surface resistance value of the top surface 41 or side surface 42 of the magnetic mold resin 40 is reduced to smaller than $10^6\Omega$, the resistance value at the interface between the metal film 60 and the magnetic mold resin 40 can be made equal to or larger than $10^6\Omega$, making it possible to prevent deterioration in the magnetic characteristics due to the eddy current.

Figure 3:
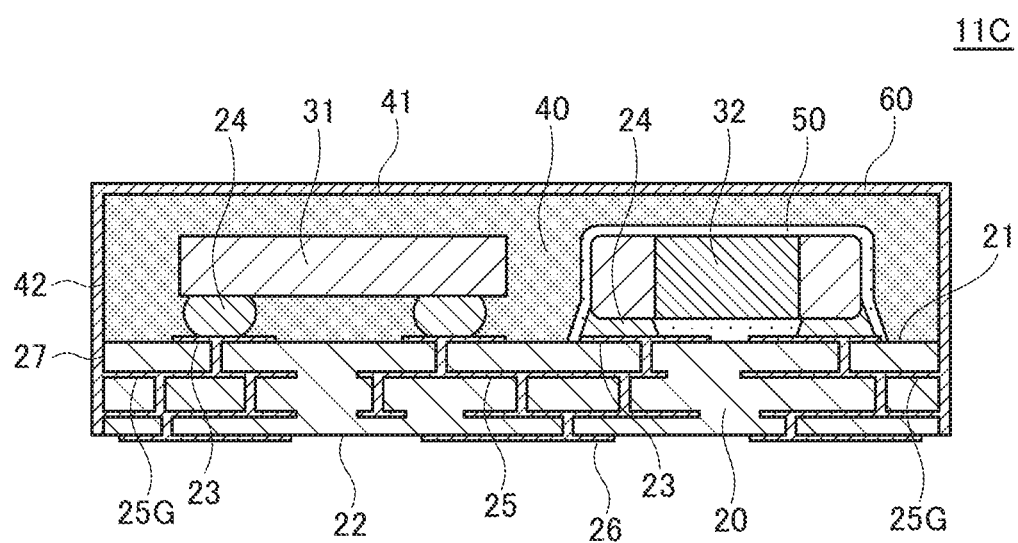
FIG. 3 is a cross-sectional view illustrating a configuration of an electronic circuit package according to a second modification of the first embodiment.

Further, when a distance between an electronic component such as a high-frequency inductor and the magnetic mold resin 40 is too small, characteristics thereof such as an inductance value may fluctuate from a design value. In such a case, the fluctuation of the characteristics can be reduced by covering a part of or the entire electronic component with a non-magnetic member. FIG. 3 is a cross-sectional view illustrating a configuration of an electronic circuit package 11C according to a second modification. The electronic circuit package 11C of FIG. 3 differs from the electronic circuit package 11A of FIG. 1 in that the electronic component 32 is covered with a non-magnetic member 50. As the non-magnetic member 50, a common resin can be used. By interposing the non-magnetic member 50 between the electronic component 32 and the magnetic mold resin 40, a sufficient distance between the electronic component 32 and magnetic mold resin 40 can be ensured, so that it is possible to reduce the fluctuation of characteristics such as the inductance value.

As described above, the electronic circuit packages 11A to 11C according to the present embodiment use the magnetic mold resin 40 and have the surfaces covered with the metal film 60. With this configuration, it is possible to obtain a composite shielding structure without using a magnetic film and the like in addition to the mold resin. This can effectively shield electromagnetic wave noise radiated from the electronic components 31 and 32 and external electromagnetic wave noise entering the electronic components 31 and 32 while achieving reduction in height. In particular, the electronic circuit packages 11A to 11C according to the present embodiment can shield the electromagnetic wave noise radiated from the electronic components 31 and 32 more effectively. This is because the electromagnetic wave noise radiated from the electronic components 31 and 32 is partly absorbed when it passes through the magnetic mold resin 40, and the remaining electromagnetic wave noise that has not been absorbed is reflected by the metal film 60 and passes through the magnetic mold resin 40 once again. As described above, the magnetic mold resin 40 acts on the incident electromagnetic wave noise twice, thereby effectively shielding the electromagnetic wave noise radiated from the electronic components 31 and 32.

Further, in the electronic circuit packages 11A to 11C according to the present embodiment, the volume resistance value of the magnetic mold resin 40 is equal to or more than $10^{10}\Omega$, it is possible to ensure sufficient insulating performance required for the mold member. In addition, the resistance value at the interface between the magnetic mold resin 40 and the metal film 60 is equal to or more than $10^6\Omega$, thereby substantially preventing the eddy current generated when the electromagnetic wave noise enters the metal film 60 from flowing into the magnetic mold resin 40. As a result, it is possible to prevent deterioration in the magnetic characteristics of the magnetic mold resin 40 due to inflow of the eddy current.

The following describes a manufacturing method for the electronic circuit package 11A according to the present embodiment.

Figure 4:
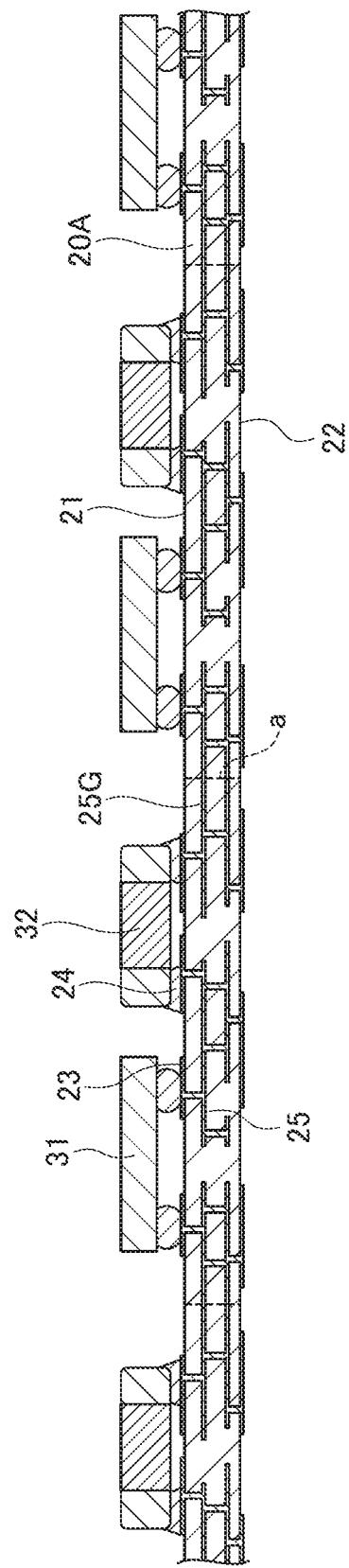
FIGS. 4 to 6 are process views for explaining a manufacturing method for the electronic circuit package shown in FIG. 1.
Figure 5:
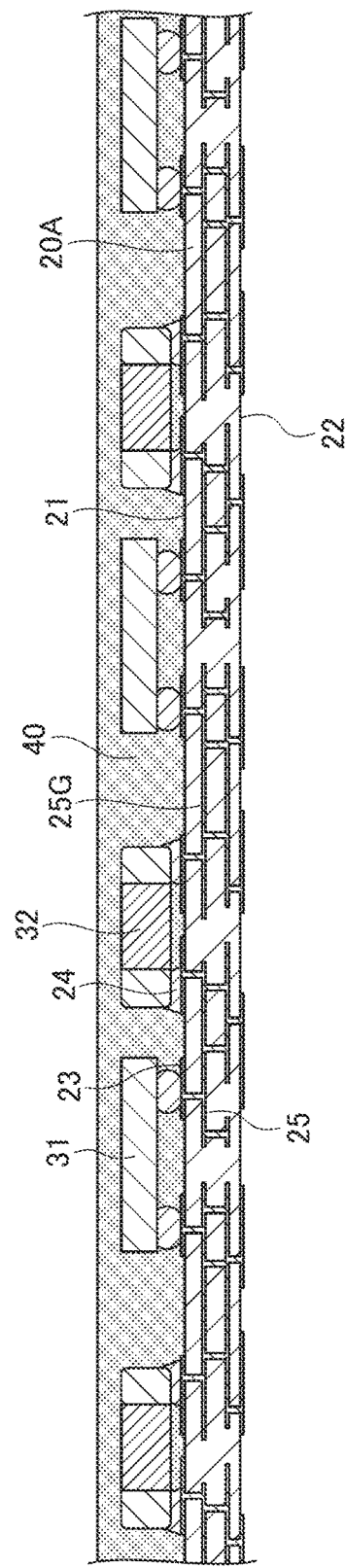
Figure 6:
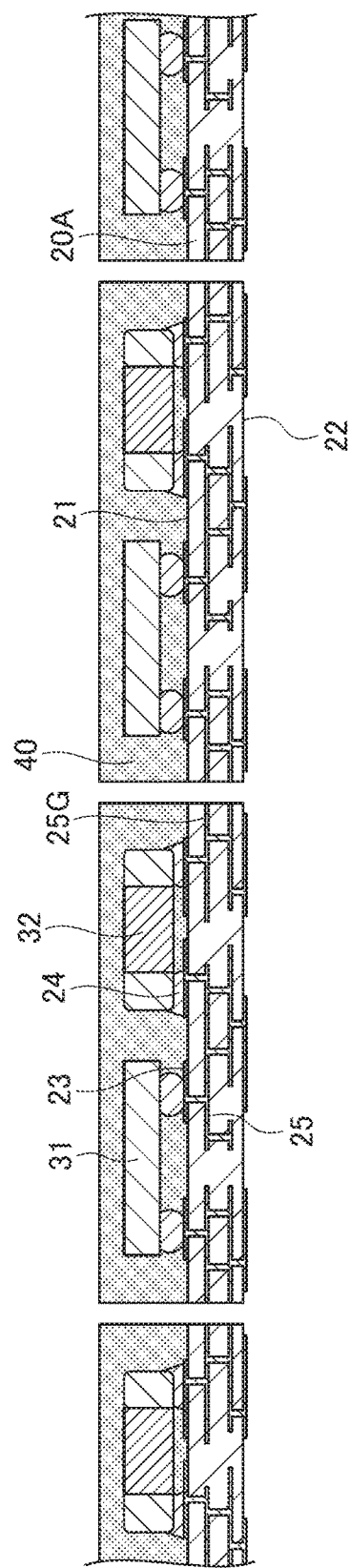

FIGS. 4 to 6 are process views for explaining a manufacturing method for the electronic circuit package 11A.

As illustrated in FIG. 4, an assembly substrate 20A having a multilayer wiring structure is prepared. A plurality of the land patterns 23 are formed on the front surface 21 of the assembly substrate 20A, and a plurality of the external terminals 26 are formed on the back surface 22 of the assembly substrate 20A. Further, a plurality of the internal wirings 25 including the power supply patterns 25G are formed in an inner layer of the assembly substrate 20A. A dashed line a in FIG. 4 denotes apart to be cut in a subsequent dicing process. As illustrated in FIG. 4, the power supply patterns 25G are provided at a position overlapping the dashed line a in a plan view.

Then, as illustrated in FIG. 4, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Then, as illustrated in FIG. 5, the front surface 21 of the assembly substrate 20A is covered with the magnetic mold resin 40 having a volume resistance value equal to or larger than $10^{10}\Omega$ so as to embed the electronic components 31 and 32 in the magnetic mold resin 40. Examples of the formation method for the magnetic mold resin 40 may include, as described above, transfer molding, compression molding, injection molding, cast molding, vacuum cast molding, dispense molding, and molding using a slit nozzle.

Then, as illustrated in FIG. 6, the assembly substrate 20A is cut along the dashed line a to divide the assembly substrate 20A into individual substrates 20. In the present embodiment, the power supply patterns 25G pass the dashed line a as a dicing position. Thus, when the assembly substrate 20A is cut along the dashed line a, the power supply patterns 25G are exposed from the side surface 27 of the substrate 20.

Then, the metal film 60 is formed so as to cover the top and side surfaces 41 and 42 of the magnetic mold resin 40 and side surface 27 of the substrate 20, whereby the electronic circuit package 11A according to the present embodiment is completed. Examples of a formation method for the metal film 60 may include a sputtering method, a vapor-deposition method, an electroless plating method, and an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film or a chromium film may be formed thinly in advance.

Further, when the insulating film 70 is interposed between the magnetic mold resin 40 and the metal film 60 as in the modification illustrated in FIG. 2, a thermosetting material, a heat-resistance thermoplastic material, or an insulating material such as an oxide of Si or a low-melting-point glass may be formed thinly on the top surface 41 and/or side surface 42 of the magnetic mold resin 40 before formation of the metal film 60.

As described above, according to the manufacturing method for the electronic circuit package 11A of the present embodiment, the magnetic mold resin 40 having a volume resistance value equal to or larger than $10^{10}\Omega$ is used, and the metal film 60 is formed on the surface of the magnetic mold resin 40, thus making it possible to obtain a composite shielding structure while achieving reduction in height.

Second Embodiment

Figure 7:
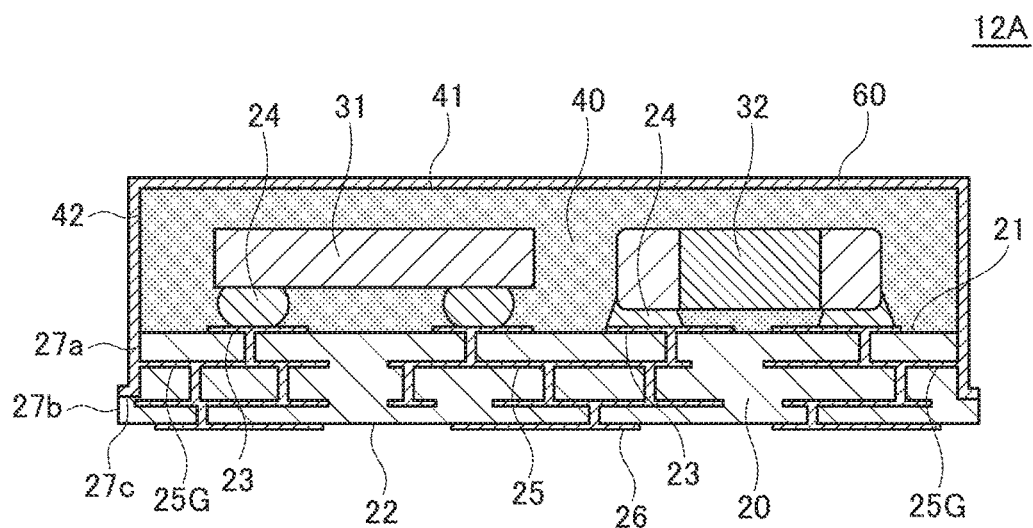
FIG. 7 is a cross-sectional view illustrating a configuration of an electronic circuit package according to a second embodiment of the present invention.

FIG. 7 is a cross-sectional view illustrating a configuration of an electronic circuit package 12A according to the second embodiment of the present invention.

As illustrated in FIG. 7, an electronic circuit package 12A according to the present embodiment is the same as the electronic circuit package 11A according to the first embodiment illustrated in FIG. 1 except for shapes of the substrate 20 and metal film 60. Thus, in FIG. 7, the same reference numerals are given to the same elements as in FIG. 1, and repetitive descriptions will be omitted.

In the present embodiment, the side surface 27 of the substrate 20 is formed stepwise. Specifically, a side surface lower portion 27b protrudes from a side surface upper portion 27a. The metal film 60 is not formed over the entire side surface of the substrate 20 but formed so as to cover the side surface upper portion 27a and a step portion 27c. That is, the side surface lower portion 27b is not covered with the metal film 60. Also in the present embodiment, the power supply patterns 25G are exposed from the side surface upper portion 27a of the substrate 20, so that the metal film 60 is connected to the power supply patterns 25G at the exposed portion. When the surface resistance value of the top surface 41 and/or side surface 42 of the magnetic mold resin 40 is smaller than $10^{6}\Omega$, the thin insulating film 70 is interposed between the magnetic mold resin 40 and the metal film 60 as in an electronic circuit package 12B according to a modification illustrated in FIG. 8.

Figure 9:
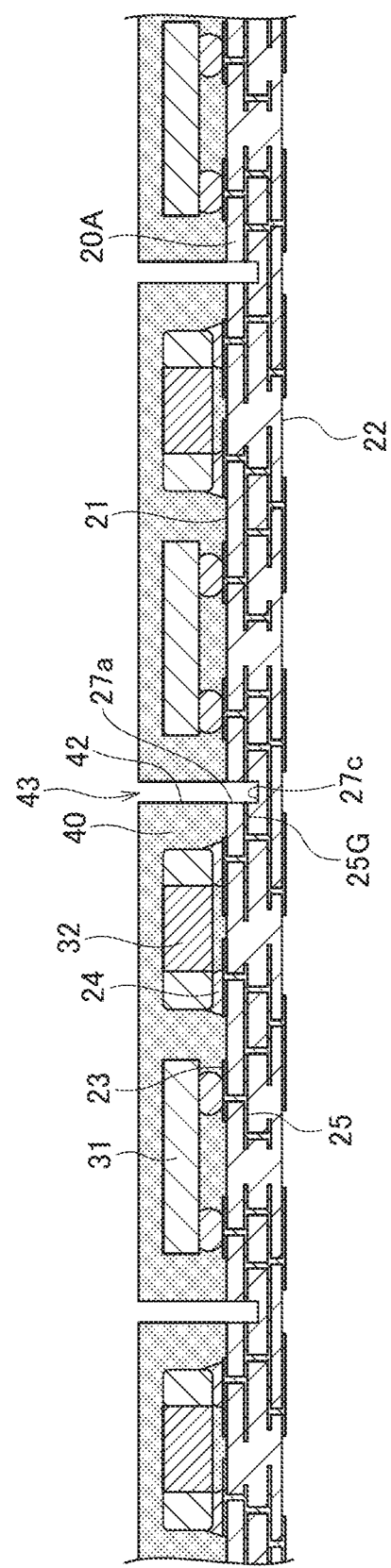
FIGS. 9 and 10 are process views for explaining a manufacturing method for the electronic circuit package shown in FIG. 7.
Figure 10:
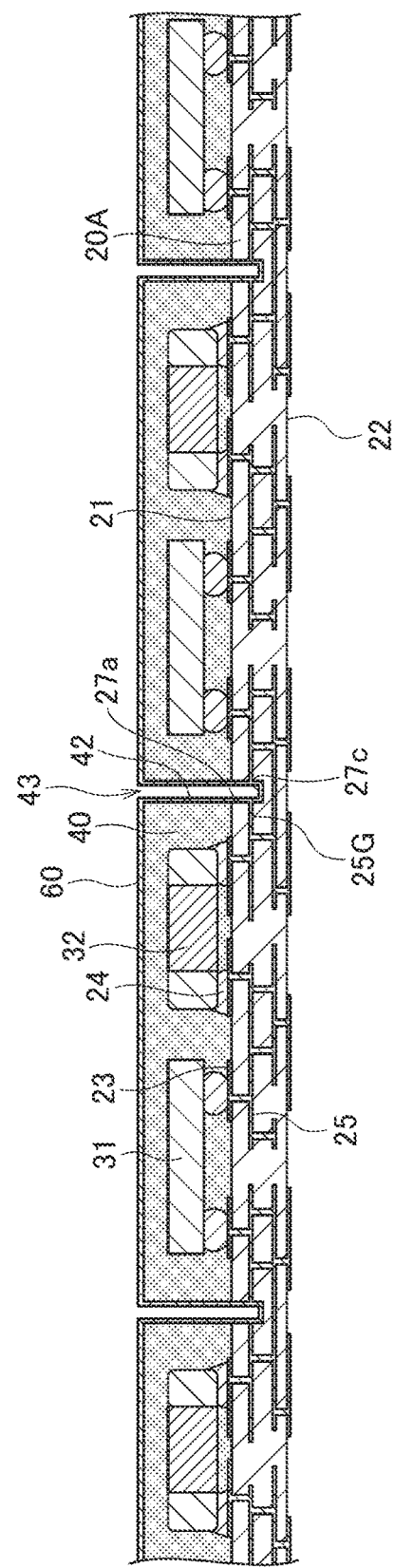

FIGS. 9 and 10 are process views for explaining a manufacturing method for the electronic circuit package 12A.

First, the magnetic mold resin 40 is formed on the front surface 21 of the assembly substrate 20A by using the method described in FIGS. 4 and 5. Then, as illustrated in FIG. 9, a groove 43 is formed along the dashed line a denoting the dicing position. The groove 43 is formed so as to completely cut the magnetic mold resin 40 and so as not to completely cut the assembly substrate 20A. As a result, the side surface 42 of the magnetic mold resin 40 and side surface upper portion 27a and step portion 27c of the substrate 20 are exposed inside the groove 43. A width of the groove 43 is set so as to allow at least the power supply patterns 25G to be exposed from the side surface upper portion 27a.

Then, as illustrated in FIG. 10, the metal film 60 is formed by using a sputtering method, a vapor-deposition method, an electroless plating method, an electrolytic plating method, or the like. As a result, the top surface 41 of the magnetic mold resin 40 and inside of the groove 43 are covered with the metal film 60. At this time, the power supply patterns 25G exposed to the side surface upper portion 27a of the substrate 20 are connected to the metal film 60.

Then, the assembly substrate 20A is cut along the dashed line a to divide the assembly substrate 20A into individual substrates 20, whereby the electronic circuit package 12A according to the present embodiment is completed.

As described above, according to the manufacturing method for the electronic circuit package 12A of the present embodiment, formation of the groove 43 allows the metal film 60 to be formed before dividing the assembly substrate 20A into individual substrates 20, thereby forming the metal film 60 easily and reliably.

Figure 8:
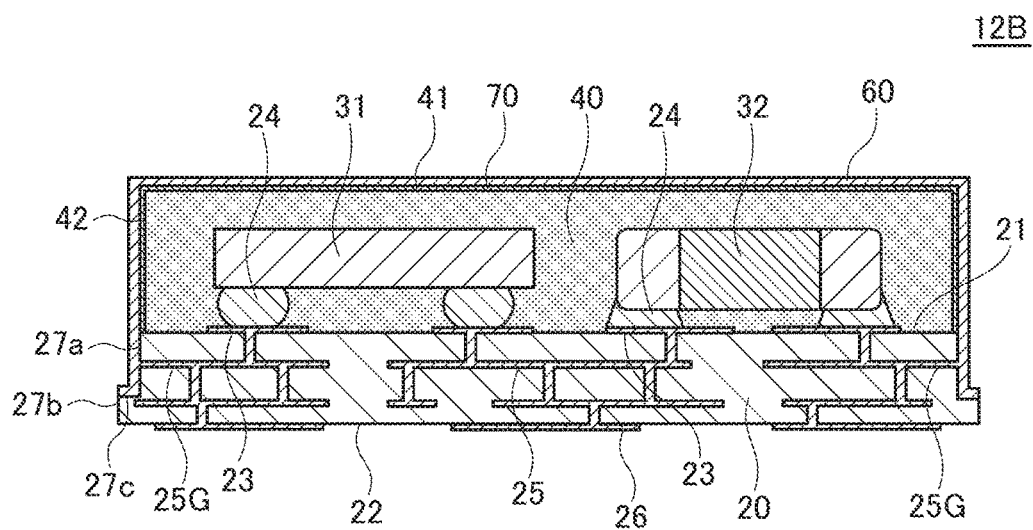
FIG. 8 is a cross-sectional view illustrating a configuration of an electronic circuit package according to a modification of the second embodiment.

When the insulating film 70 is interposed between the magnetic mold resin 40 and the metal film 60 as in the modification illustrated in FIG. 8, a thermosetting material, a heat-resistance thermoplastic material, or an insulating material such as an oxide of Si or a low-melting-point glass may be formed thinly on the top surface 41 and/or side surface 42 of the magnetic mold resin 40 before formation of the metal film 60.

Third Embodiment

Figure 11:
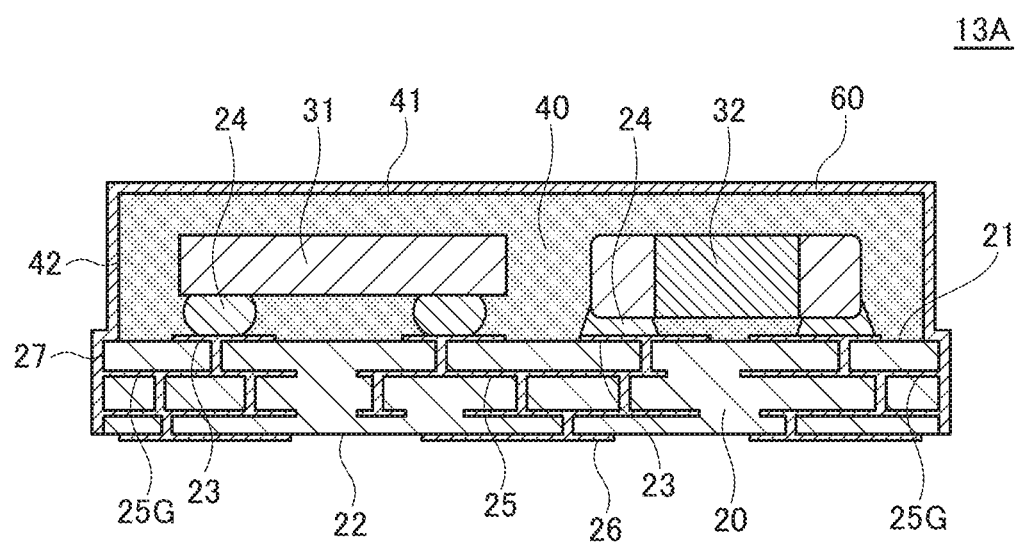
FIG. 11 is a cross-sectional view illustrating a configuration of an electronic circuit package according to a third embodiment of the present invention.

FIG. 11 is a cross-sectional view illustrating a configuration of an electronic circuit package 13A according to the third embodiment of the present invention.

As illustrated in FIG. 11, an electronic circuit package 13A according to the present embodiment differs from the electronic circuit package 11A according to the first embodiment illustrated in FIG. 1 in that a planar size of the magnetic mold resin 40 is slightly smaller than a planar size of the substrate 20 and, therefore, an outer peripheral portion of the front surface 21 of the substrate 20 is exposed from the magnetic mold resin 40. Other configurations are the same as those of the electronic circuit package 11A according to the first embodiment. Thus, in FIG. 11, the same reference numerals are given to the same elements as in FIG. 1, and repetitive descriptions will be omitted.

As exemplified by the electronic circuit package 13A according to the present embodiment, it is not essential in the present invention that the side surface 42 of the magnetic mold resin 40 and the side surface 27 of the substrate 20 form the same plane, but the planar size of the magnetic mold resin 40 may be smaller than that of the substrate 20.

Figure 12:
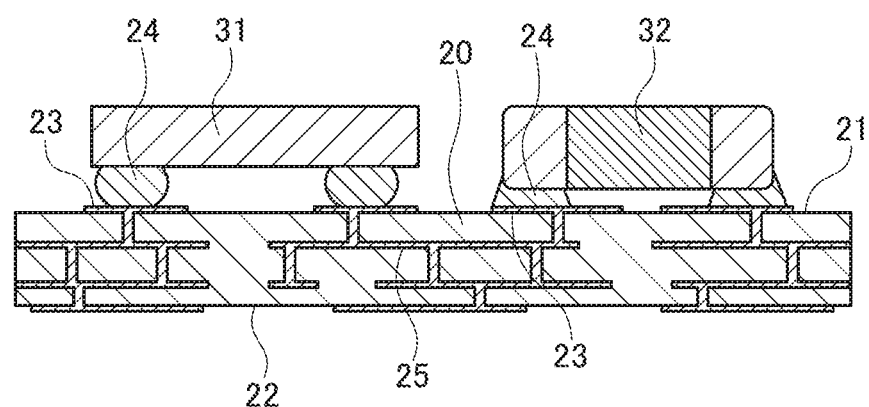
FIGS. 12 to 14 are process views for explaining a manufacturing method for the electronic circuit package shown in FIG. 11.
Figure 13:
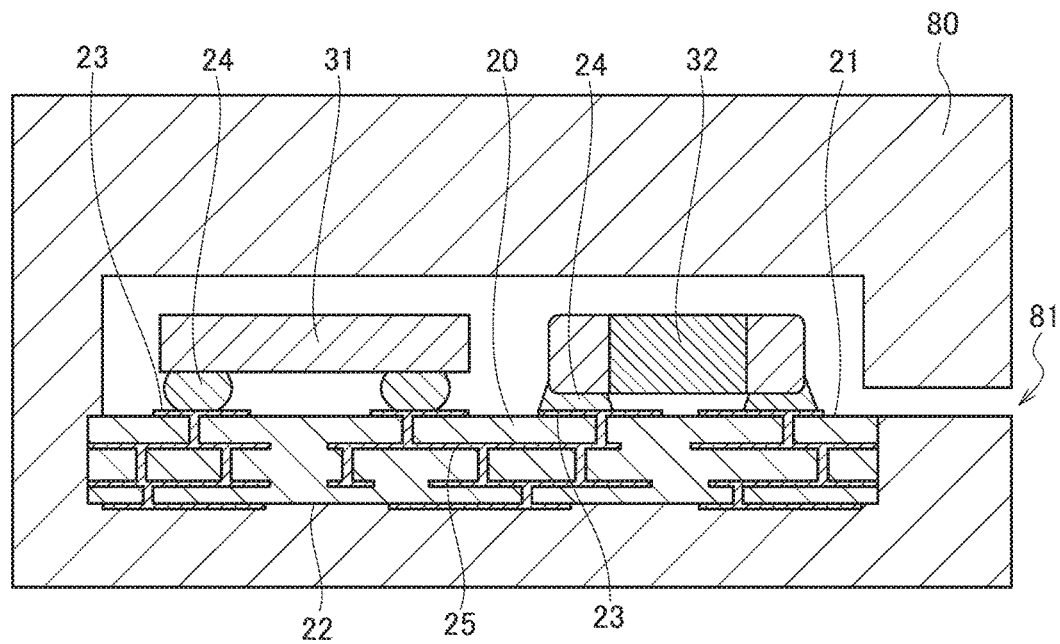
Figure 14:
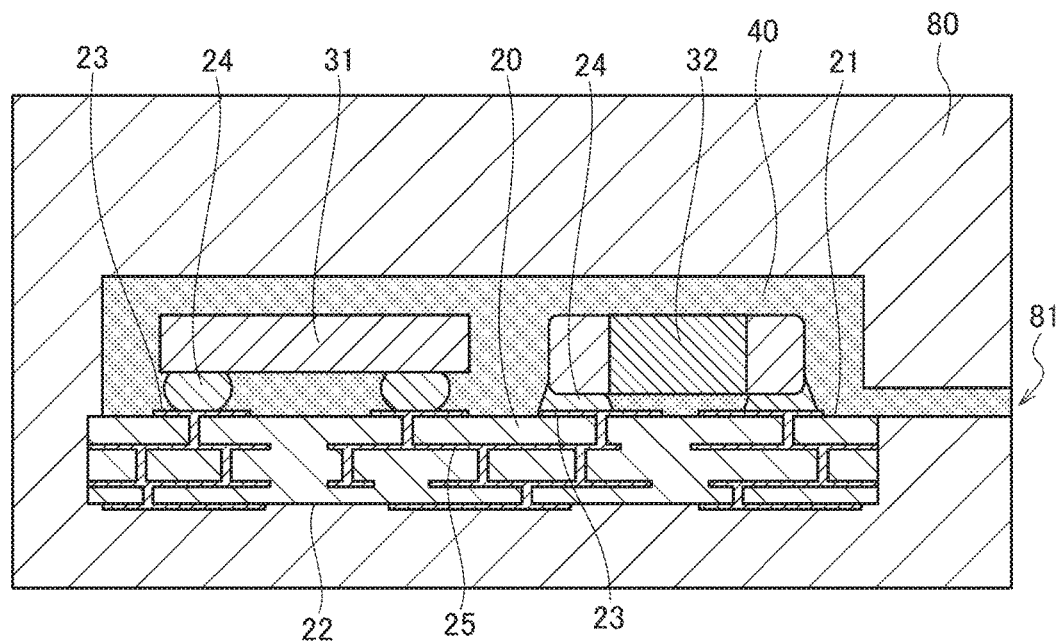

FIGS. 12 to 14 are views for explaining a manufacturing method for the electronic circuit package 13A.

First, as illustrated in FIG. 12, the substrate 20 is prepared by previously cutting the assembly substrate 20A into individual pieces, and the plurality of electronic components 31 and 32 are mounted on the substrate 20 so as to be connected to the land patterns 23 on the front surface 21 of the substrate 20. Specifically, the solder 24 is provided on the land patterns 23, followed by mounting of the electronic components 31 and 32 and by reflowing, whereby the electronic components 31 and 32 are connected to the land pattern 23.

Then, as illustrated in FIG. 13, the substrate 20 on which the electronic components 31 and 32 are mounted is set in a mold 80. Then, as illustrated in FIG. 14, a composite magnetic material which is a material forming the magnetic mold resin 40 is injected along a flow path 81 of the mold 80, followed by pressuring and heating. Thereafter, the substrate 20 is taken out of the mold 80, and the metal film 60 is formed on the top and side surfaces 41 and 42 of the magnetic mold resin 40 and the side surface 27 of the substrate 20, whereby the electronic circuit package 13A according to the present embodiment is completed.

As described above, the magnetic mold resin 40 may be formed after dividing the assembly substrate 20A into individual substrates 20.

Figure 15:
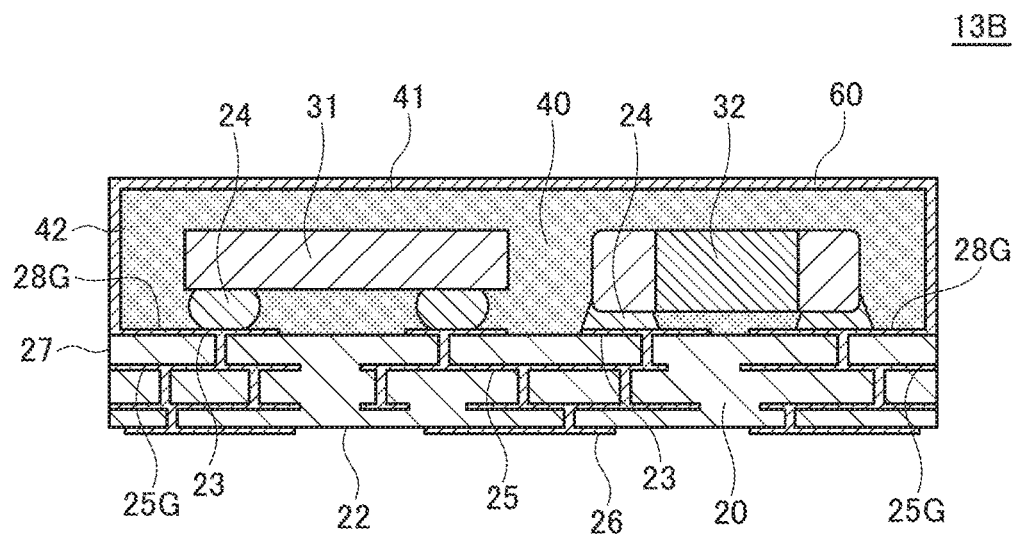
FIG. 15 is a cross-sectional view illustrating a configuration of an electronic circuit package according to a modification of the third embodiment.

Further, as illustrated in FIG. 15 which illustrates an electronic circuit package 13B as a modification of the third embodiment, a structure in which the metal film 60 does not cover the side surface 27 of the substrate 20 may be employed. In this case, a power supply patterns 28G are provided at an outer peripheral portion of the surface 21 of the substrate 20 that is exposed from the magnetic mold resin 40 and contacts the metal film 60. As a result, a fixed potential such as a ground potential is applied to the metal film 60.

Fourth Embodiment

Figure 16:
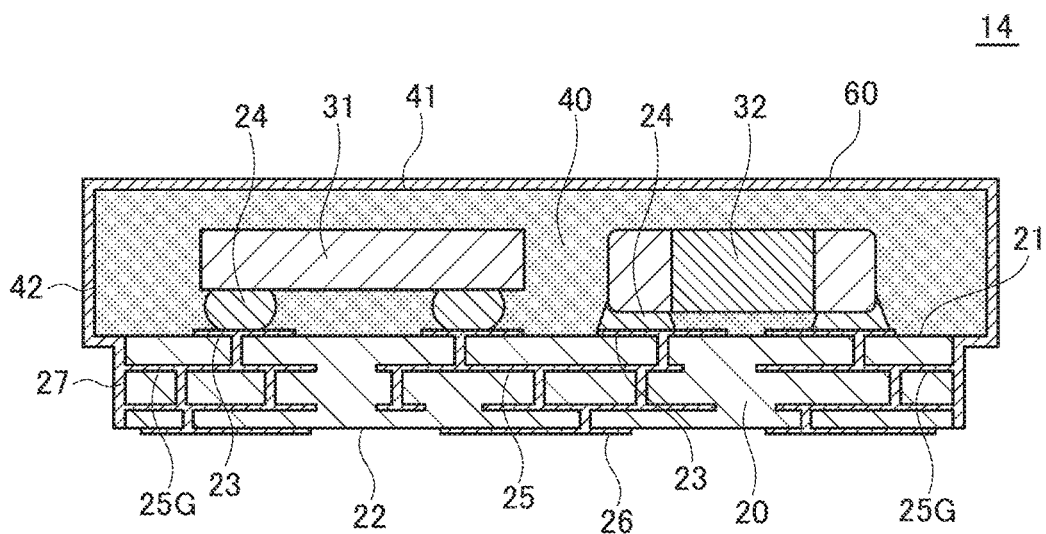
FIG. 16 is a cross-sectional view illustrating a configuration of an electronic circuit package according to a fourth embodiment of the present invention.

FIG. 16 is a cross-sectional view illustrating a configuration of an electronic circuit package 14 according to the fourth embodiment of the present invention.

As illustrated in FIG. 16, an electronic circuit package 14 according to the present embodiment differs from the electronic circuit package 11A according to the first embodiment illustrated in FIG. 1 in that the planar size of the magnetic mold resin 40 is slightly larger than the planar size of the substrate 20. Other configurations are the same as those of the electronic circuit package 11A according to the first embodiment. Thus, in FIG. 16, the same reference numerals are given to the same elements as in FIG. 1, and repetitive descriptions will be omitted.

As exemplified by the electronic circuit package 14 according to the present embodiment, in the present invention, the planar size of the magnetic mold resin 40 may be larger than that of the substrate 20.

While the preferred embodiments of the present invention have been described, the present invention is not limited thereto. Thus, various modifications may be made without departing from the gist of the invention, and all of the modifications thereof are included in the scope of the present invention.

EXAMPLES

<Formation of Magnetic Filler>

First, AKT4.5Si-5.0Cr (D50=30 μm) manufactured by Mitsubishi Steel MFG. Co. Ltd and Carbonyl iron powder (D50=6 μm) manufactured by BASF were prepared, and an $SiO_2$ coating was applied by the hydrolysis of metal alkoxide. A film thickness of the $SiO_2$ coating was set at five levels (0 nm (no $SiO_2$ coating), 5 nm, 10 nm, 30 nm, and 40 nm). The film thickness was observed by using an FE-SEM.

<Formation of Composite Magnetic Material>

Then, AKT4.5Si-5.0Cr (D50=30 μm) and Carbonyl iron powder were measured such that a weight ratio thereof becomes 8:2, and 90 wt % of the obtained mixture were added to a thermosetting resin. The thermosetting resin and solvent used were as follows: HP-7200H (dicyclopentadiene type epoxy resin) manufactured by DIC. Co., Ltd. as a main agent; TD2231 (phenol novolac) manufactured by DIC. Co., Ltd. as a curing agent; 2 wt % of U-CAT SA841 (DBU-phenol novolak resin salt) manufactured by Sun-Apro Co., Ltd. relative to the main agent, as a curing accelerator. These agents were blended, and heated and kneaded using a kneader, whereby the composite magnetic material was obtained.

<Measurement of Permeability>

The above composite magnetic material was used to produce ring-shaped samples each having an outer diameter φ of 8 mm, an inner diameter φ of 3.1 mm, and a thickness of 2 mm, and a permeability μ' at 10 MHz was measured using a material analyzer function of Impedance Analyzer E4991 manufactured by Agilent Co. LTD. As a result of the measurement, the permeability μ' was in a range of 13.8 to 14.5 irrespective of the film thickness of the $SiO_2$ coating, and there was no significant difference between the samples (see FIG. 17).

<Measurement of Volume Resistance Value and Surface Resistance Value>

Then, the above composite magnetic material was used to produce disk-shaped samples each having an outer diameter φ of 100 mm and a thickness of 2 mm, electrodes were formed on a surface of each sample, and the volume resistance value and surface resistance value were measured by applying a voltage of 500 V between the electrodes for one minute. This test was made according to JIS K6911. Results are illustrated in FIG. 17.

As illustrated in FIG. 17, it was confirmed that the larger the film thickness of the $SiO_2$ coating is, the larger the volume resistance value and surface resistance value become. Specifically, the volume resistance value and surface resistance value were $10^7 \Omega$ when the film thickness of the $SiO_2$ coating is 5 nm; while the volume resistance value and surface resistance value were $10^{12} \Omega$ when the film thickness of the $SiO_2$ coating is 10 nm. Thus, it was confirmed that sufficient volume resistance and surface resistance values could be obtained when the film thickness of the $SiO_2$ coating is equal to or larger than 10 nm. Since grinding is not applied to the surface of each sample, the volume resistance value and surface resistance value exhibit the same value in the above measurement test.

<Formation of Samples for Measurement of Noise Attenuation Amount>

[Formation of Sample A1]

The above composite magnetic material was mold-formed on a substrate for shielding evaluation on which a 50Ω resistor is mounted by compression molding. For this sample A1, a composite magnetic material in which the film thickness of the $SiO_2$ coating formed on the surface of the magnetic filler is 30 nm was used. The sample A1 was thus completed. Note that the metal film serving as an electromagnetic shielding was not formed in the sample A1.

[Formation of Sample A2]

A non-magnetic material was mold-formed, by compression molding, on a substrate for shielding evaluation on which a 50Ω resistor is mounted. As the non-magnetic material, G-770H manufactured by Sumitomo Bake-lite Co., Ltd., which is a common type semiconductor sealing material, was used and sealed/molded under a recommended molding condition. Thereafter, cutting was done using a dicer for individualization to expose the ground pattern to the side surface of the substrate. Then, electroless plating was applied to form the metal film including laminated films of Cu (film thickness of 1 μm) and Ni (film thickness of 2 μm) on the top and side surfaces of the mold resin and the side surface of the substrate, whereby the sample A2 was obtained. Therefore, the sample A2 does not have a magnetic shielding.

[Formation of Sample A3]

A composite magnetic material was mold-formed, by compression molding, on a substrate for shielding evaluation on which a 50Ω, resistor is mounted. For this sample A3, a composite magnetic material in which no $SiO_2$ coating (i.e., film thickness is 0 nm) is applied on the surface of the magnetic filler was used. Thereafter, as in the case of the sample A2, cutting was done for individualization, and metal film was formed, whereby the sample A3 was obtained.

[Formation of Sample A4]

A composite magnetic material was mold-formed, by compression molding, on a substrate for shielding evaluation on which a 50Ω resistor is mounted. For this sample A4, a composite magnetic material in which a film thickness of $SiO_2$ coating is 5 nm is applied on the surface of the magnetic filler was used. Thereafter, as in the case of the sample A2, cutting was done for individualization, and metal film was formed, whereby the sample A4 was obtained.

[Formation of Sample B1]

A composite magnetic material was mold-formed, by compression molding, on a substrate for shielding evaluation on which a 50Ω resistor is mounted. For this sample B1, a composite magnetic material in which a film thickness of $SiO_2$ coating is 10 nm is applied on the surface of the magnetic filler was used. Thereafter, as in the case of the sample A2, cutting was done for individualization, and metal film was formed, whereby the sample B1 was obtained.

[Formation of Sample B2]

A composite magnetic material was mold-formed, by compression molding, on a substrate for shielding evaluation on which a 50Ω resistor is mounted. For this sample B2, a composite magnetic material in which a film thickness of $SiO_2$ coating is 30 nm is applied on the surface of the magnetic filler was used. Thereafter, as in the case of the sample A2, cutting was done for individualization, and metal film was formed, whereby the sample B2 was obtained.

[Formation of Sample B3]

A composite magnetic material was mold-formed, by compression molding, on a substrate for shielding evaluation on which a 50Ω resistor is mounted. For this sample B3, a composite magnetic material in which a film thickness of $SiO_2$ coating is 40 nm is applied on the surface of the magnetic filler was used. Thereafter, as in the case of the sample A2, cutting was done for individualization, and metal film was formed, whereby the sample B3 was obtained.

<Measurement of Noise Attenuation Amount>

Samples A1 to A4 and B1 to B3 were connected to a signal generator, and a signal of a predetermined frequency (20 MHz, 50 MHz, 100 MHz) was transmitted to the 50Ω resistor, whereby an amount of noise reflected from each sample was measured by using a neighboring magnetic field measuring apparatus. On the other hand, a reference sample having no magnetic mold resin and no metal film was previously produced, and a noise amount radiated from the reference sample was measured. Then, a difference between the noise amount in the reference sample and the noise amount in each of the samples A1 to A4 and B1 to B3 was calculated as a noise attenuation amount. Measurement results are illustrated in FIG. 17.

As illustrated in FIG. 17, relative to the sample A1 having no metal film, the samples B1 to B3 exhibited a shielding characteristics improvement effect of 22 dBμV to 23 dBμV at a frequency of 20 MHz, 28 dBμV to 29 dBμV at a frequency of 50 MHz, and 32 dBμV to 33 dBμV at a frequency of 100 MHz. Further, relative to the sample A2 that uses not the magnetic mold resin, but a common mold resin, the samples B1 to B3 exhibited a shielding characteristics improvement effect of 15 dBμV to 16 dBμV at a frequency of 20 MHz, 16 dBμV to 17 dBμV at a frequency of 50 MHz, and 14 dBμV to 15 dBμV at a frequency of 100 MHz. Further, relative to the samples A3 and A4 whose film thicknesses of the $SiO_2$ coating formed on the magnetic filler are 0 nm and 5 nm, respectively, the samples B1 to B3 exhibited a shielding characteristics improvement effect of 6 dBμV to 9 dBμV at a frequency of 20 MHz, 7 dBμV to 10 dBμV at a frequency of 50 MHz, and 5 dBμV to 7 dBμV at a frequency of 100 MHz.

As a result, it was confirmed that high shielding characteristics can be obtained by forming the magnetic mold resin using a composite magnetic material in which the $SiO_2$ coating having a thickness equal to or larger than 10 nm is applied on the magnetic filler and covering the surface of the thus formed magnetic mold resin with the metal film.

What is claimed is:

1. An electronic circuit package comprising:
   a substrate having a power supply pattern;
   an electronic component mounted on a surface of the substrate;
   a magnetic mold resin formed of a composite magnetic material including a thermosetting resin material and a magnetic filler, the magnetic mold resin covering the surface of the substrate so as to embed therein the electronic component; and
   a metal film connected to the power supply pattern and covering at least a top surface of the magnetic mold resin,
   wherein a volume resistance value of the magnetic mold resin is equal to or larger than $10^{10}Ω$, and a resistance value at an interface between the top surface of the magnetic mold resin and the metal film is equal to or larger than $10^6Ω$.

2. The electronic circuit package as claimed in claim 1, wherein the metal film further covers a side surface of the magnetic mold resin, and a resistance value at an interface between the side surface of the magnetic mold resin and the metal film is equal to or larger than $10^6Ω$.

3. The electronic circuit package as claimed in claim 1, further comprising an insulating material provided between the magnetic mold resin and the metal film.

4. The electronic circuit package as claimed in claim 1, wherein the magnetic filler includes a soft magnetic metal.

5. The electronic circuit package as claimed in claim 4, wherein a surface of the magnetic filler is coated by an insulation coat.

6. The electronic circuit package as claimed in claim 5, wherein a film thickness of the insulation coat is equal to or larger than 10 nm.

7. The electronic circuit package as claimed in claim 4, wherein a shape of the magnetic filler is substantially spherical.

8. The electronic circuit package as claimed in claim 4, wherein a main component of the magnetic filler is at least one magnetic material selected from a group consisting of Fe, Fe—Co, Fe—Ni, Fe—Al, and Fe—Si.

9. The electronic circuit package as claimed in claim 1, wherein the magnetic mold resin further include a non-magnetic filler.

10. The electronic circuit package as claimed in claim 1, wherein the metal film is mainly composed of at least one metal selected from a group consisting of Au, Ag, Cu, and Al.

11. The electronic circuit package as claimed in claim 10, wherein the surface of the metal film is covered with an antioxidant film.

12. The electronic circuit package as claimed in claim 1, wherein the power supply pattern is exposed to a side surface of the substrate, and the metal film contacts the power supply pattern exposed on the side surface of the substrate.

13. The electronic circuit package as claimed in claim 1, further comprising a non-magnetic member provided between the electronic component and the magnetic mold resin.

* * * * *